(12) United States Patent
Kunishi et al.

(10) Patent No.: US 9,595,945 B2
(45) Date of Patent: Mar. 14, 2017

(54) SWITCH CONTROL CIRCUIT AND SWITCH CIRCUIT

(71) Applicant: KABUSHIKI KAISHA TOSHIBA, Tokyo (JP)

(72) Inventors: Yugo Kunishi, Yokohama Kanagawa (JP); Toshifumi Ishimori, Yokohama Kanagawa (JP); Toshiki Seshita, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/056,883

(22) Filed: Feb. 29, 2016

(65) Prior Publication Data

US 2016/0269003 A1 Sep. 15, 2016

(30) Foreign Application Priority Data

Mar. 13, 2015 (JP) ................................ 2015-051324

(51) Int. Cl.
G05F 1/10 (2006.01)
H03K 3/356 (2006.01)
G05F 3/24 (2006.01)
H03K 17/693 (2006.01)

(52) U.S. Cl.
CPC ......... *H03K 3/356017* (2013.01); *G05F 3/24* (2013.01); *H03K 17/693* (2013.01); *H03K 2217/0081* (2013.01)

(58) Field of Classification Search
CPC ... H03K 3/356017; H03K 17/162; G05F 3/24

USPC ........ 327/108–112, 427, 434, 437, 384, 379, 327/404, 407, 409, 537, 333; 326/82, 83, 326/87; 455/78, 77, 83
See application file for complete search history.

(56) References Cited

U.S. PATENT DOCUMENTS 8,295,784 B2 10/2012 Seshita
2007/0013432 A1* 1/2007 Miyazawa ........... H03K 17/005
327/404

(Continued)

FOREIGN PATENT DOCUMENTS

JP 2000-294786 A 10/2000
JP 2010028304 A 2/2010

(Continued)

*Primary Examiner* — Lincoln Donovan
*Assistant Examiner* — Thomas Skibinski
(74) *Attorney, Agent, or Firm* — Patterson & Sheridan, LLP

(57) ABSTRACT

A switch control circuit includes a plurality of first voltage generation circuits that generate a plurality of second control signals by level-shifting a plurality of first control signals using a reference voltage. A plurality of cut-off circuits controlling whether or not to supply the reference voltage to a corresponding one of the plurality of first voltage generation circuits. A control circuit is configured to control the cut-off circuits in such a manner that the reference voltage supplied to at least one first voltage generation circuit is cut off to the other first voltage generation circuits after a state of the first control signal supplied to the at least one first generation circuit is changed. In some embodiments, the reference voltage to the other first generation circuits is cut-off for a predetermined time period.

20 Claims, 7 Drawing Sheets

(56) References Cited

U.S. PATENT DOCUMENTS

| | | | |
|---|---|---|---|
| 2011/0159822 A1* | 6/2011 | Kunishi | H03K 3/354 |
| | | | 455/78 |
| 2012/0049938 A1* | 3/2012 | Ishimori | H03K 17/063 |
| | | | 327/537 |
| 2014/0132333 A1 | 5/2014 | Jin et al. | |

FOREIGN PATENT DOCUMENTS

| | | | |
|---|---|---|---|
| JP | 2013175834 A | 9/2013 | |
| JP | 2013229647 A | 11/2013 | |
| WO | 03032431 A2 | 4/2003 | |

\* cited by examiner

SWITCH CONTROL CIRCUIT AND SWITCH CIRCUIT

CROSS-REFERENCE TO RELATED APPLICATION

This application is based upon and claims the benefit of priority from Japanese Patent Application No. 2015-051324, filed Mar. 13, 2015, the entire contents of which are incorporated herein by reference.

FIELD

Embodiments described herein relate generally to a switch control circuit and a switch circuit.

BACKGROUND

Wireless communication using several frequency bandwidths has been performed. Presently, a switch circuit IC is obtained by integrating a plurality of high-frequency switches into one-package is used in this application. When communication is performed using a selected signal frequency bandwidth, a signal path of the selected frequency bandwidth is switched on and a signal path of a non-selected signal frequency bandwidth (that is, the one not being presently used for signal transmission) is switched off. As such, there is a possibility that a power supply potential that is supplied to a signal path through which communication is performed (the selected signal path) may temporarily vary, and that, in consequence, insertion loss and high-frequency characteristics of the high-frequency switch will be temporarily degraded.

DETAILED DESCRIPTION

Embodiments provide a switch control circuit and a switch circuit which are configured in such a manner that variation of a power supply due to signal switching is insubstantial.

According to an embodiment, a switch control circuit includes a plurality of first voltage generation circuits configured to generate a plurality of second control signals by level-shifting a plurality of first control signals using a reference voltage. The switch control circuit also includes a plurality of cut-off circuits configured to connect and disconnect the reference voltage to or from a corresponding one of the plurality of first voltage generation circuits. A control circuit in the switch control circuit is configured to control the plurality of cut-off circuits such that at least one first voltage generation circuit in the plurality of first voltage generation circuits is disconnected from the reference voltage when a state (e.g., signal logic) of a first control signal of at least one other first voltage generation circuit in the plurality of first voltage generation circuits changes.

Hereinafter, embodiments will be described with reference to the drawings. The following embodiments will be described with a focus on characteristic configurations and operations of a switch control circuit and a switch circuit, but configurations and operations which are omitted in the following description may exist in the switch control circuit and the switch circuit. However, such omitted configurations and operations are also included in the scope of the present embodiments.

Figure 1:
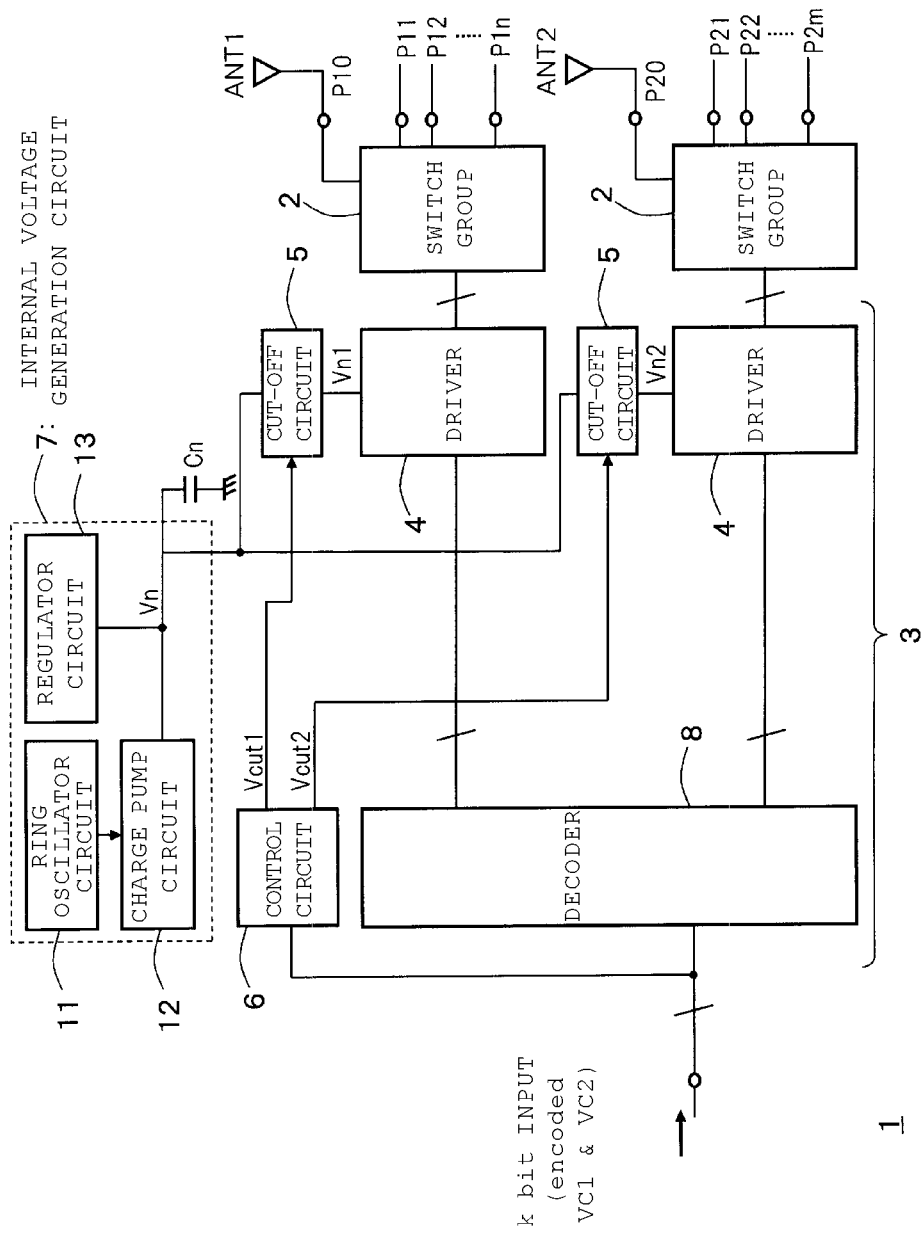
FIG. 1 is a block diagram illustrating a schematic configuration of a switch circuit according to an embodiment.

FIG. 1 is a block diagram illustrating a schematic configuration of a switch circuit 1 according to an embodiment. The switch circuit 1 in FIG. 1 includes a plurality of switch groups 2, and a switch control circuit 3 that controls the switch groups 2. FIG. 1 depicts two switch groups 2, but the number of switch groups 2 may be greater than two, with the total number of switch groups 2 may corresponds to the number of signal paths or communication bands controlled by in the switch circuit.

The switch control circuit 3 includes a plurality of drivers (first voltage generation circuit) 4, a plurality of cut-off circuits 5, a control circuit 6, an internal voltage generation circuit (second voltage generation circuit) 7, and a decoder 8.

The plurality of drivers 4 generate a plurality of second control signals that level-shift a plurality of first control signals that are output from the decoder 8, using an internal voltage (reference voltage) Vn generated by the internal voltage generation circuit 7. The plurality of cut-off circuits 5 switch whether or not to supply an internal voltage (e.g., Vn1, Vn2 . . . ) to the plurality of drivers 4.

The control circuit 6 outputs a signal logic of cut-off control signal (e.g., Vcut1, Vcut2 . . . ) which is input to a corresponding cut-off circuit 5 from among the plurality of cut-off circuits 5 for a predetermined period. That is, the control circuit 6 is configured to output a cut-off control signal to each one of the drivers 4. That is, when a signal logic of one of the first control signals is changed, the control circuit 6 controls the cut-off circuit 5 in such a manner that the reference voltage is supplied to at least one of the plurality of first voltage generation circuits (drivers 4) for which the first control signal has not changed, thus at least one of the plurality of first voltage generations circuits (drivers 4) is cut off for a predetermined period. While signal logic of the cut-off control signal (e.g., Vcut1 or Vcut2) is changed, the cut-off circuit 5 stops applying the reference voltage to the corresponding driver 4. The predetermined period is, for example, between several microseconds (µs) and several tens of microseconds (µs).

As illustrated in FIG. 1, the internal voltage generation circuit 7 includes a ring oscillator circuit 11, a charge pump circuit 12, and a regulator circuit 13. The ring oscillator circuit 11 generates an oscillation signal having a predetermined frequency. The charge pump circuit 12 generates a voltage that is obtained by increasing or decreasing a power supply voltage by using the power supply voltage supplied from outside the switch circuit 1 and the oscillation signal supplied from the ring oscillator circuit 11. The regulator circuit 13 generates an internal voltage by performing waveform shaping or the like on the voltage that is generated by the charge pump circuit 12. The internal voltage Vn that is generated by the internal voltage generation circuit 7 as illustrated in FIG. 1 is, for example, a negative potential that is lower than a ground potential. The internal voltage Vn is, for example, approximately −3 V.

The second control signal (from each driver 4) for driving the switch group 2 is generated using a negative potential in the present embodiment in order to decrease a threshold value of each switch that configures the switch group 2 as much as possible, to decrease an ON resistance, and to reduce insertion loss of the switch. When the threshold value of a switch is decreased to approximately 0 V, in order to reliably turn off the switch, it is necessary to supply a negative potential. Thus, in the present embodiment, the second control signal is generated using a negative potential.

While omitted in FIG. 1, an internal voltage generation circuit 7 that generates an internal voltage higher than the power supply voltage may be provided separately. Alternatively, an internal voltage higher than the power supply voltage may be directly input from the outside of the switch circuit 1.

The decoder 8 decodes an input control signal that is input from the outside of the switch circuit 1, and generates the plurality of first control signals from the input control signal. The decoder 8 is not essential, and in some embodiments the first control signals may be directly input from outside of the switch circuit 1 without being decoded by a decoder 8.

Each of the plurality of switch groups 2 includes a plurality of switches that switch to connect any one of a plurality of ports (e.g., P11 to P1n and P21 to P2m) to respective common signal ports (e.g., P10 and P20), based on second control signals. As depicted in FIG. 1, antennas ANT1 and ANT2 are respectively connected to common signal ports P10 and P20. That is, for example, the upper switch group 2 in FIG. 1 can be controlled to electrically connect any one of the ports P11 to Pin to the antenna ANT1 (via common signal port P10) by application of the second control signal(s) from the driver 4 connected to the upper switch group 2 in FIG. 1.

Figure 2:
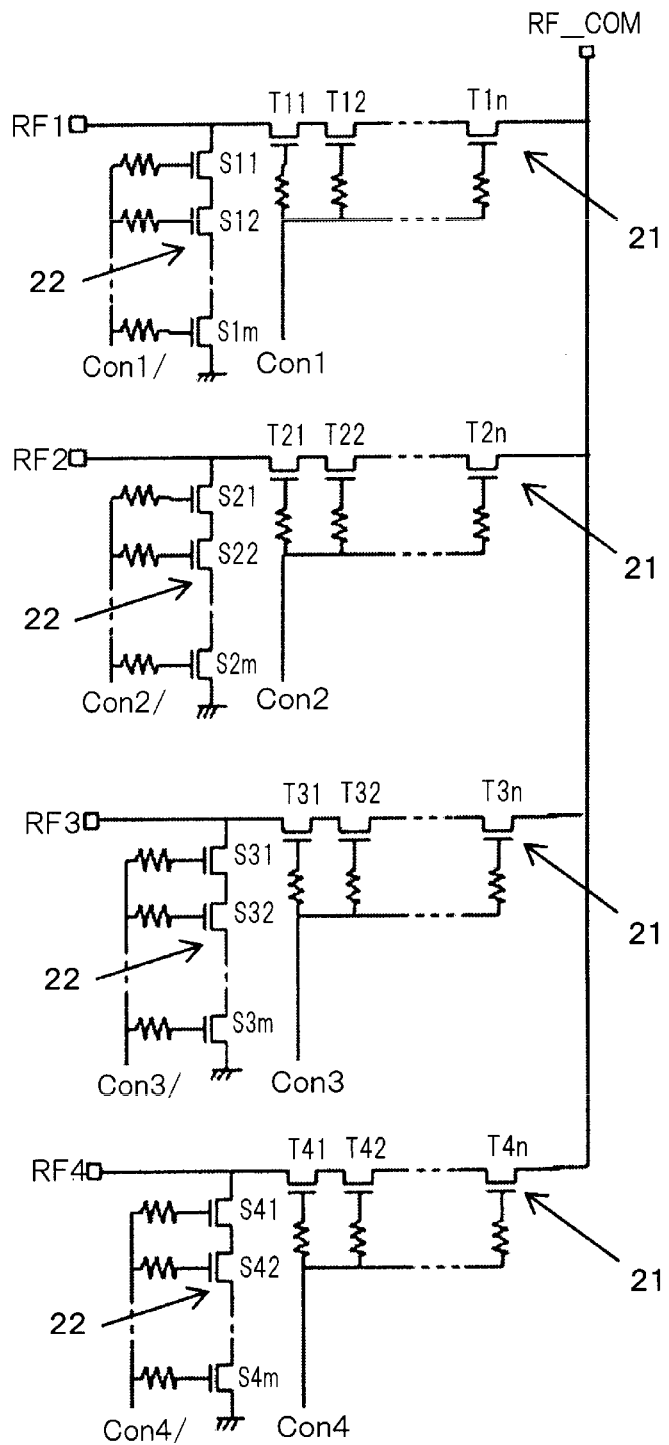
FIG. 2 is a circuit diagram illustrating an example of an internal configuration of a switch group.

FIG. 2 is a circuit diagram illustrating an example of an internal configuration of a switch group 2. FIG. 2 is a circuit diagram illustrating an internal configuration of a single-pole 4-throw (SP4T) switch that selects one port from among four ports to be connected to a common port. The SP4T switch switches connections from any one of the four RF terminals RF1 to RF4 to a common RF terminal RF_COM according to the four respective second control signals Con1 to Con4. The number of RF terminals is not specifically limited, and the number used can correspond to the number of input/output channels for the respective communication band.

The SP4T switch in FIG. 2 includes a pass-through FET 21 comprising a plurality of FETs connected in series between the common RF terminal RF_COM and each of the four RF terminals RF1 to RF4. A shunt FET 22 comprises a plurality of FETs respectively connected in series between each of the RF terminals (RF1, RF2, RF3, RF4 . . . ) and a ground node. A threshold voltage Vth of each FET in switch group 2 is, for example, 0 V.

The plurality of FETs for each of the pass-through FET 21 and the shunt FET 22 is made in order to reduce the required voltage that must be applied to each FET by sharing a voltage amplitude with the plurality of FETs which are connected in series. Because, when signals are transmitted, the RF terminals RF1 to RF4 have a voltage amplitude which may be of several tens of volts.

For example, an operation of the SP0T switch in FIG. 2 will be described with using a case in which the RF terminal RF1 is connected to the common RF terminal RF_COM, as an example. In this case, the second control signal Con1 has a high potential (Von), the pass-through FET 21 having a gate to which the second control signal Con1 is input is turned on, and the shunt FET 22 that is connected between the RF terminal RF1 and a ground terminal is turned off. In addition, all of the other pass-through FET 21 are turned off, and all of the other shunt FET 22 are turned on.

A potential Von of the second control signal Con1 may be obtained when the pass-through FET 21 is turned on, whereby an ON resistance thereof becomes small enough. The potential Von is, for example, 3 V. Potentials Voff of the second control signals Con2 to Con4 are a gate potential which may be maintained in a cut-off state of the pass-through FET 21, even when the RF signal is input to the RF terminals RF2 to RF4. The potential Voff is the voltage Vn that is generated by the internal voltage generation circuit 7 in FIG. 1, and is, for example, −3 V.

Even when the pass-through FET 21 is turned off, a leakage current can still be generated through an OFF capacitance of a high-frequency switch circuit (switch group) 2 depicted in FIG. 2, and this leakage current will flow through the shunt FET 22.

Two switch groups 2 are illustrated in FIG. 1, but the number of the switch groups 2 is not limited. For example, in a case that while wireless communication is performed using a port that is selected by the switch group 2 on an upper side in FIG. 1, a port is switched by the switch group 2 on a lower side in FIG. 1, the internal voltage Vn output from the internal voltage generation circuit 7 which is supplied to the driver 4 that is connected to the switch group 2 on the upper side may vary at the moment when the port is switched. The driver 4 generates the second control signal that is obtained by level-shifting the first control signal, using the power supply voltage on a negative side which is supplied from the internal voltage generation circuit 7, and the power supply voltage on a positive side which is supplied from another internal voltage generation circuit (not specifically illustrated) or the like. However, at the moment when the port is switched, a voltage level on a negative side of the second control signal of the switch group 2 increases, and the power supply voltage on a negative side varies due to this influence. When the power supply voltage on a negative side varies, a voltage level on a negative side of the second control signal of a different switch group 2 can also be increased, while harmonic characteristics and insertion loss of the other switch group 3 (or other switch groups 2) are also degraded. In this way, at the moment when a port is switched, the voltage level on a negative side of the second control signal that is output from the driver 4 may be increased.

Thus, in the present embodiment, the cut-off circuit 5 is connected between each driver 4 and the internal voltage generation circuit 7, a port is switched by the cut-off circuit 5 that is connected to the switch group 2 which does not switch a port, whereby an internal voltage is not supplied for some predetermined period to the other switch group.

The entire switch circuit 1 in FIG. 1 may be implemented in an integrated circuit (IC). Alternatively, all of the switch control circuits 3 may be incorporated in an IC, and the switch groups 2 may be incorporated in another IC. When integrated into a single IC, it is preferable that the switch circuit 1 is formed on a silicon-on-insulator (SOI) substrate rather than a silicon substrate. The reason is that in the SOI device, a MOS transistor has a parasitic capacitance smaller than if formed in the silicon substrate, and thus the SOI device has a smaller power loss of a high-frequency signal.

Figure 3:
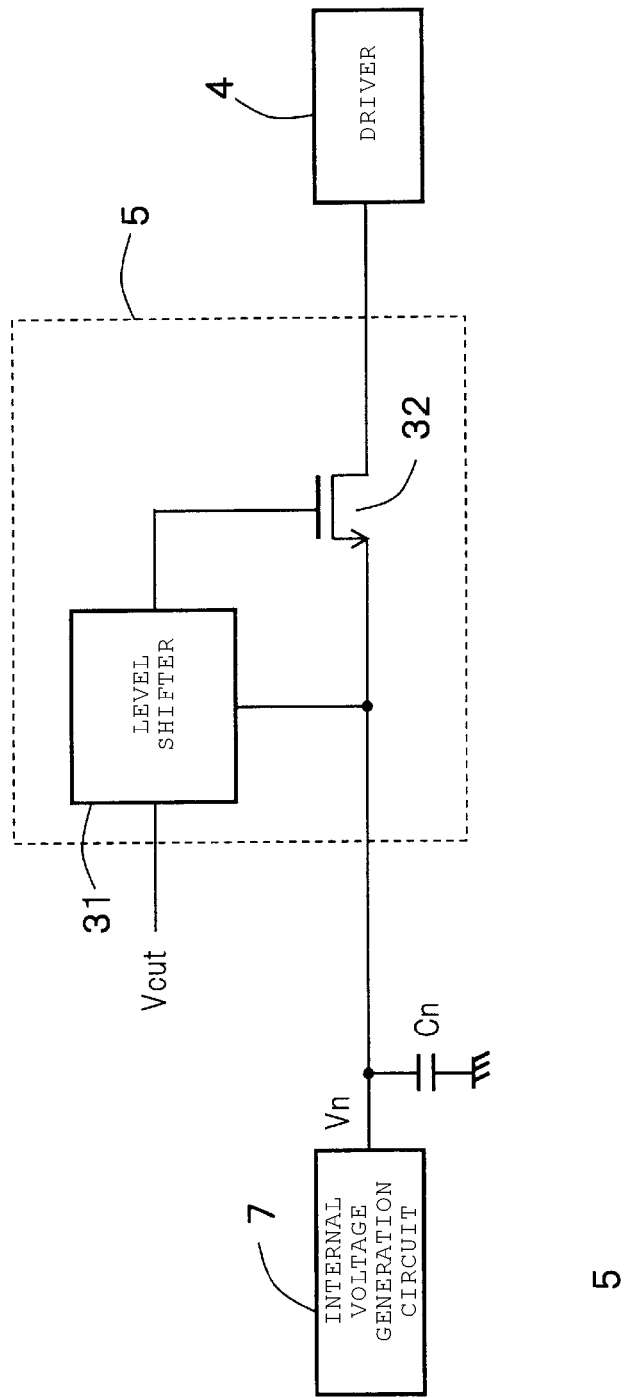
FIG. 3 is a block diagram illustrating an example of an internal configuration of a cut-off circuit.

FIG. 3 is a block diagram illustrating an example of an internal configuration of a cut-off circuit 5. The cut-off circuit 5 in FIG. 3 includes a level shifter 31 and a switching element 32. The level shifter 31 outputs, in accordance with a potential of the cut-off control signal Vcut that is output from the control circuit 6, a potential higher than both of the internal potential Vn that is supplied from the internal voltage generation circuit 7, the internal potential that is supplied from an internal circuit (not illustrated), or the ground potential, and supplies the potential to the gate of the switching element 32.

The switching element 32 is, for example, an NMOS transistor (n-channel metal-oxide-semiconductor transistor). Thus, when the gate increases to a voltage equal to or higher than a threshold voltage, compared to a source thereof the switching element 32 is turned on.

For example, when the control signal Vcut has a high level and the internal voltage Vn is −3 V, a voltage level of the control signal Vcut is level-shifted up to a voltage level (for example, approximately 0 V) higher than the threshold voltage of the switching element 32, so as to reliably turn off the switching element 32. Owing to this, when the control signal Vcut has a high level, the switching element 32 is turned off, and the internal voltage Vn is not supplied to the driver 4.

Figure 4:
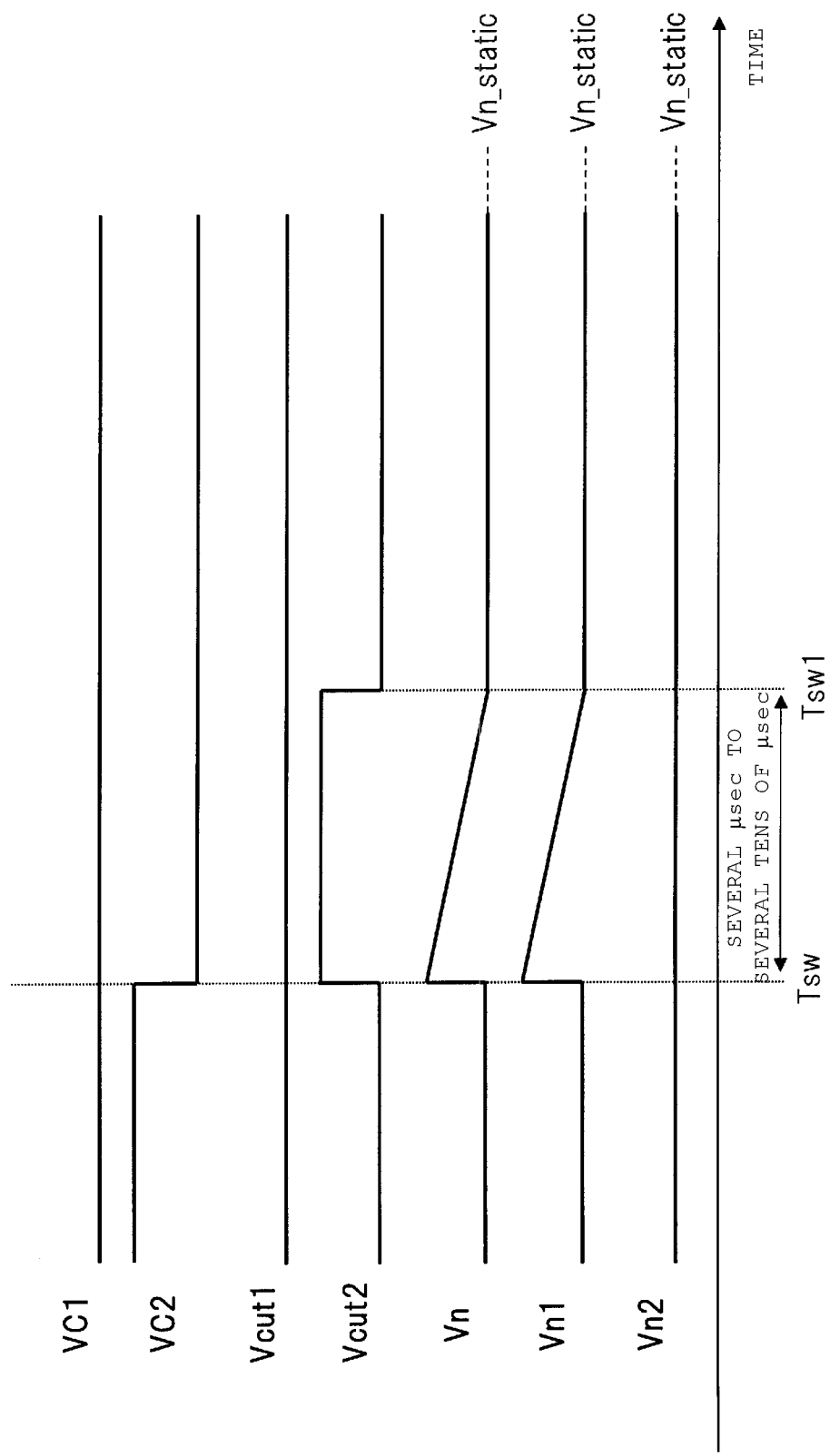
FIG. 4 is a signal waveform diagram of each unit in a switch control circuit.

FIG. 4 is a signal waveform diagram of each unit in the switch control circuit 3. FIG. 4 illustrates an example in which a port is switched by the switch group 2 on an upper side of FIG. 1, at the time of time $T_{SW}$. The control circuit 6 detects whether or not a port is switched. The control circuit 6 monitors the input control signals (e.g., k bit INPUT signal including signals VC1 and VC2 corresponding to respective control signals for each switch group 2) to the decoder 8, and identifies which driver 4 the logic change(s) corresponds to when the input control signals VC1 and VC2 in the k bit INPUT signal are changed. Then, signal logics of the control signals Vcut1 and Vcut2 that command cut-off of the internal voltage Vn are switched by the respective cut-off circuit 5 which is connected to the corresponding driver 4. In FIG. 4, when port switching of the switch group 2 on an upper side is detected at the time $T_{SW}$, the control circuit 6 changes the control signal Vcut2 from low to high. Owing to this, the cut-off circuit 5 that is connected to the lower side driver 4 does not supply the internal voltage Vn2 with any changed value to the lower side driver 4 for at least a predetermined period (up to time Tsw1). That is, the internal voltage Vn2 is flat (constant low level) during the predetermined period. Here, the predetermined period is a short period between several microseconds (μs) and several tens of microseconds (μs), and even when the internal voltage Vn output from the internal voltage generation circuit 7 is not supplied to power supply voltage lines of the driver 4 during the predetermined period, the power supply voltage lines do not fluctuate in value. In the signal waveform diagram in FIG. 4, the power supply voltage lines of the drivers 4 become substantially the same potential (Vn_static) as each other around the time Tsw.

Meanwhile, the cut-off circuit 5 that is connected to the driver 4 corresponding to the switch group 2, which switches a port, (that is, the drive 4 on an upper side of FIG. 1) does not cut off the internal voltage Vn, and thus, the negative potential Vn1 of the switch group 2 is rapidly increased by the port switching of the switch group 2. According to this, the internal voltage Vn1 that is supplied to the driver 4 on the upper side rapidly increases at the time $T_{SW}$. However, the rapid voltage change is temporary, and in addition, wireless communication is not performed immediately after the port is switched, and thus practical problems which might otherwise occur during communication while the internal voltage Vn1 varies do not occur.

It is preferable that a length of the predetermined period in which supplying of the internal voltage (e.g., Vn1 or Vn2) is stopped by the cut-off circuit 5 is set by taking into account a voltage level of the internal voltage, a parasitic capacitance of the power supply voltage line of the driver 4, and the like.

After the predetermined period is ended, it is not necessary to take any action in such a manner that a temporary increase of the power supply voltage line does not all occur.

Figure 5:
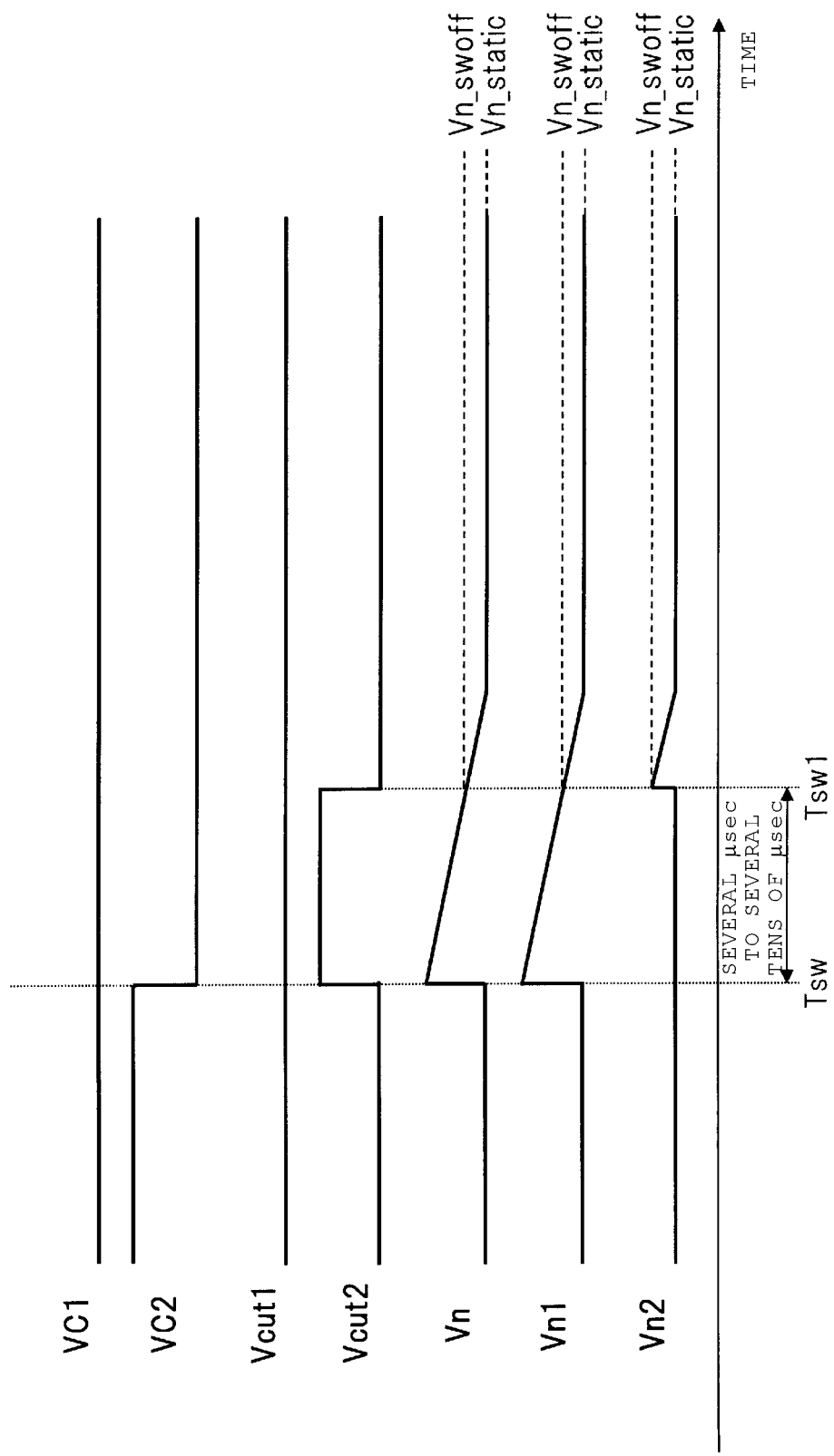
FIG. 5 is a signal waveform diagram according to a modification example in FIG. 4.

FIG. 5 is a signal waveform diagram according to a modification example of the switching process depicted in FIG. 4. In FIG. 5, at the time Tsw1 when the predetermined period ends, an example in which the power supply voltage line of the driver 4 on the lower side slightly increases is illustrated. In the example in FIG. 5, while a voltage in a normal state is Vn_static, the voltage slightly increases up to Vn_swoff at the time of Tsw1. However, although the power supply voltage line of the driver 4 on the lower side slightly increases, when the second control signal that is generated by the driver 4 on the lower side may still correctly turn on or off the switch group 2 on a subsequent stage side thereof, there is no practical problem.

In this way, the length of the predetermined period may be set within a range in which a switching operation of the switch group 2 is not unintentionally activated—that is, the end time (Tsw1) of the predetermined period may be set such that value of internal voltage Vn does not reach the Vn_static value before the period terminates, so long as the value Vn_swoff applied to the driver 4 of the lower side group does not result in an unintended activation (switching) of the lower side switch group.

Figure 6:
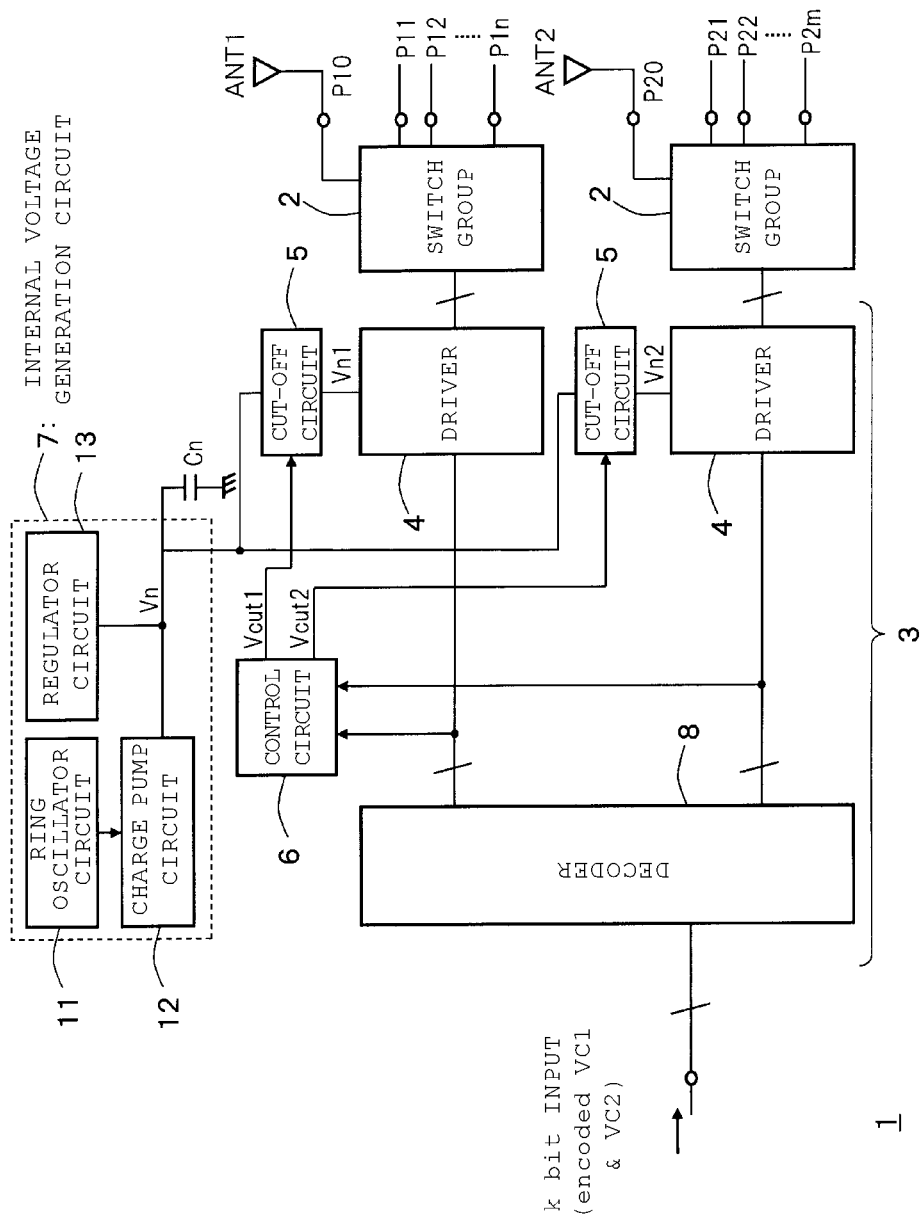
FIG. 6 is a signal waveform diagram according to another modification example in FIG. 4.

The control circuit 6 in FIG. 1 controls cut-off timing of a plurality of cut-off circuits 5, based on the input control signal that is input to the decoder 8. As illustrated in FIG. 6, the control circuit 6 may control cut-off timing of the plurality of cut-off circuits 5, based on a plurality of first control signals that is output from the decoder 8. When an arbitrary switch group 2 in the plurality of switch groups 2 switches a port, a signal logic of any one of the plurality of first control signals is changed. Thus, by monitoring the plurality of first control signals, the control circuit 6 may simply and easily detect which one of the drivers 4 should be cut off by the respective cut-off circuit 5.

However, the number of the plurality of first control signals that are output from the decoder 8 may be considerably more than the number of the input control signals that are input to the decoder 8. Thus, when the control circuit 6 monitors the plurality of first control signals, the number of the input signals to the control circuit 6 is increased more than that in FIG. 1.

However, in FIG. 1, the control circuit 6 has to itself perform decoding processing of the input control signal, and an internal configuration of the control circuit 6 may become complicated. Thus, a configuration in FIG. 1 or FIG. 6 may be selected according to the number of bits of the input control signals, the number of the plurality of first control signals, or the like.

Figure 7:
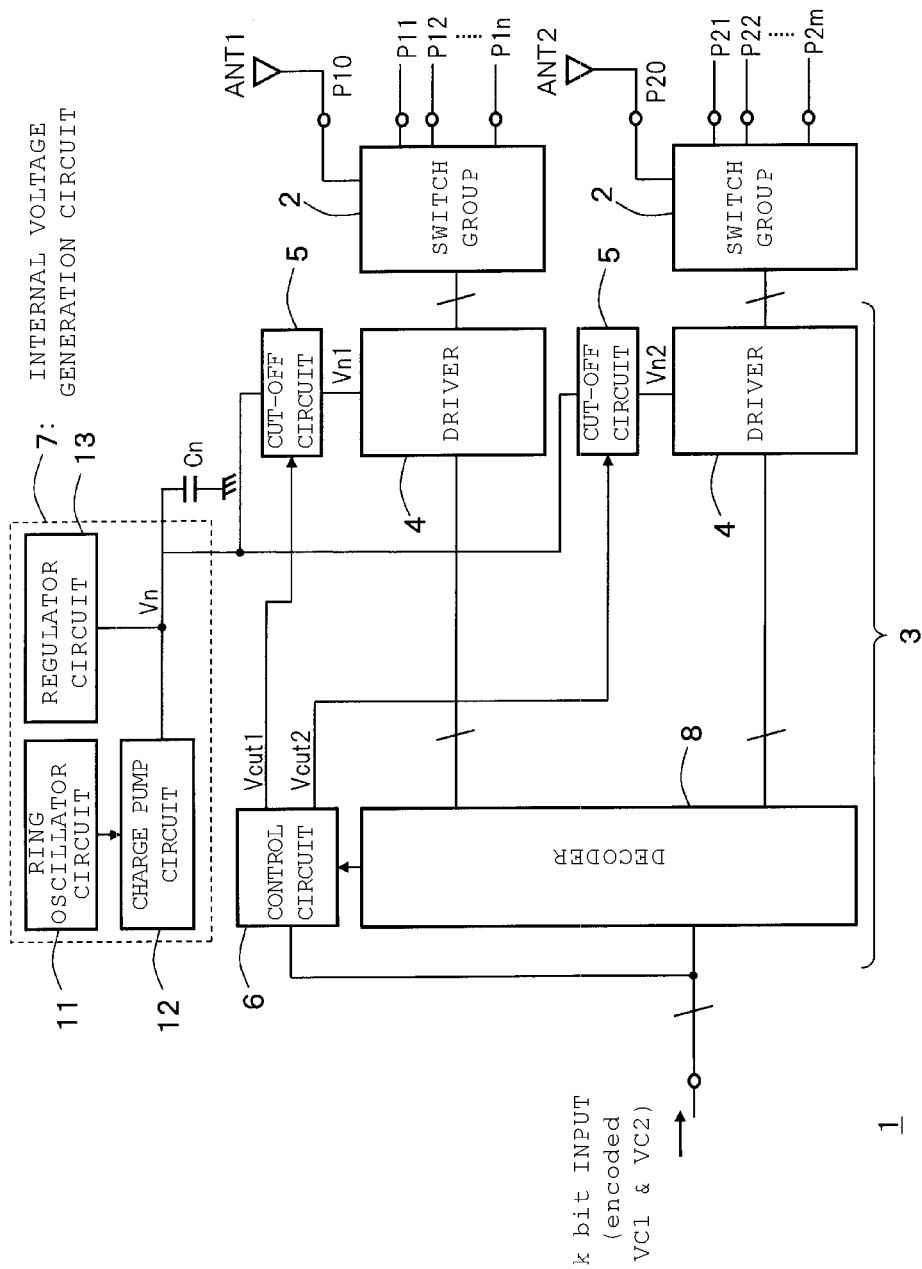
FIG. 7 is a signal waveform diagram according to still another modification example in FIG. 4.

In addition, a control circuit 6 in FIG. 7 may be also considered as an intermediate configuration between FIG. 1 and FIG. 6. The decoder 8 in FIG. 7 generates the plurality of first control signals by decoding the input control signal, and also generates a third control signal for the control circuit 6. The control circuit 6 in FIG. 7 controls cut-off timing of the plurality of cut-off circuits 5, based on the third control signal. For example, the number of the third control signals is greater than that of the input control signals, and is smaller than that of the plurality of first control signals. Thus, in some cases, the internal configuration of the control circuit 6 may be simplified more than that in FIG. 1 or FIG. 7.

In this way, in the present embodiment, when a port is switched by any one of the plurality of switch groups 2 that may simultaneously perform wireless communication, the internal voltage is not supplied (via the cut-off circuit 5) for a predetermined period to the driver 4 that is connected to the switch group 2 which does not switch a port. Thus, there is no abnormality that the internal voltage Vn supplied to the switch group 2 which does not switch a port varies greatly under the influence of the switching of a port. Thus, it is possible to reduce off distortion of the switch groups 2 that are connected to the other drivers 4, and unintended activation of switching the switch group 2 is not generated. Thus, when a port is switched by a certain switch group 2, insertion loss of the other switch groups 2 is not increased, and degradation of high-frequency characteristics may be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed:

1. A switch control circuit, comprising:
    a plurality of first voltage generation circuits configured to generate a plurality of second control signals by level-shifting a plurality of first control signals using a reference voltage;
    a plurality of cut-off circuits configured to connect and disconnect the reference voltage to or from a corresponding one of the plurality of first voltage generation circuits; and
    a control circuit configured to control the plurality of cut-off circuits such that at least one first voltage generation circuit in the plurality of first voltage generation circuits is disconnected from the reference voltage when a state of a first control signal of at least one other first voltage generation circuit in the plurality of first voltage generation circuits changes.

2. The switch control circuit according to claim 1, wherein the at least one first voltage generation circuit is disconnected from the reference voltage for a predetermined time period when the state of the first control signal of the at least one other first voltage generation circuit changes.

3. The switch control circuit according to claim 1, further comprising:
    a second voltage generation circuit configured to generate the reference voltage, wherein
    the control circuit is configured to generate a cut-off control signal for each cut-off circuit of the plurality of cut-off circuits.

4. The switch control circuit according to claim 1, wherein the reference voltage is a negative potential that is lower than a ground potential.

5. The switch control circuit according to claim 1, further comprising:
    a decoder configured to decode an input control signal and to generate the plurality of first control signals according to the input control signal, wherein
    the control circuit is configured to receive the input control signal and to determine if the state of the first control signal of the at least one other first voltage generation circuit changes based on the input control signal.

6. The switch control circuit according to claim 1, further comprising:
    a decoder configured to decode an input control signal and to generate the plurality of first control signals according to the input control signal, wherein
    the control circuit is configured to receive the plurality of first control signals from the decoder and to determine if the state of the first control signal of the at least one other first voltage generation circuit changes based on the plurality of first control signals from the decoder.

7. The switch control circuit according to claim 1, further comprising:
    a decoder configured to decode an input control signal and to generate the plurality of first control signals according to the input control signal and a third control signal according to the input control signal, wherein
    the control circuit is configured to determine if the state of the first control signal of the at least one other first voltage generation circuit changes based on the third control signal from the decoder.

8. A switch circuit, comprising:
    a first switch group configured to selectively connect a first plurality of signal ports to a first common terminal;
    a second switch group configured to selectively connect a second plurality of signal ports to a second common terminal; and
    a switch control circuit configured to supply control signals to control connections in the first and second switch groups, the switch control circuit including:
    a plurality of first voltage generation circuits configured to generate a plurality of second control signals by level-shifting a plurality of first control signals using a reference voltage;
    a plurality of cut-off circuits configured to connect and disconnect the reference voltage to or from a corresponding one of the plurality of first voltage generation circuits; and
    a control circuit configured to control the plurality of cut-off circuits such that at least one first voltage generation circuit in the plurality of first voltage generation circuits is disconnected from the reference voltage when a state of a first control signal of at least one other first voltage generation circuit in the plurality of first voltage generation circuits changes.

9. The switch circuit according to claim 8, wherein the at least one first voltage generation circuit is disconnected from the reference voltage for a predetermined time period when the signal logic of the first control signal of the at least one other first voltage generation circuit is changed.

10. The switch circuit according to claim 8, the switch control circuit further including:
    a second voltage generation circuit configured to generate the reference voltage, wherein
    the control circuit is configured to generate a cut-off control signal for each cut-off circuit of the plurality of cut-off circuits.

11. The switch circuit according to claim 8, wherein the reference voltage is a negative potential that is lower than a ground potential.

12. The switch circuit according to claim 8, the switch control circuit further including:
   a decoder configured to decode an input control signal and to generate the plurality of first control signals according to the input control signal.

13. The switch circuit according to claim 12, wherein the control circuit is configured to receive the input control signal and to determine if the state of the first control signal of the at least one other first voltage generation circuit changes based on the input control signal.

14. The switch circuit according to claim 12, wherein the control circuit is configured to receive the plurality of first control signals from the decoder and to determine if the state of the first control signal of the at least one other first voltage generation circuit changes based on the plurality of first control signals from the decoder.

15. The switch circuit according to claim 8, the switch control circuit further including:
   a decoder configured to decode an input control signal and to generate the plurality of first control signals according to the input control signal and a third control signal according to the input control signal, wherein
   the control circuit is configured to determine if the state of the first control signal of the at least one other first voltage generation circuit changes based on the third control signal from the decoder.

16. A switch control circuit, comprising:
   a first driver circuit connectable to a first switch group that switches connections between a first plurality signal ports and a first common terminal, the first driver circuit configured to supply control signals for the first switch group according to a first switching signal and a first reference voltage;
   a second driver circuit connectable to a second switch group that switches connections between a second plurality signal ports and a second common terminal, the second driver circuit configured to supply control signals for the second switch group according to a second switching signal and a second reference voltage;
   a first cut-off circuit configured to supply the first reference voltage to the first driver circuit according to a first cut-off control signal; and
   a first control circuit configured to cause the first cut-off circuit to stop supply of the first reference voltage to the first driver circuit when a state of the second switching signal changes.

17. The switch control circuit according to claim 16, further comprising:
   a second cut-off circuit configured to supply the second reference voltage to the second driver circuit according to a second cut-off control signal, wherein
   the first control circuit is further configured to cause the second cut-off circuit to stop supply of the second reference voltage to second driver circuit when a state of the first switching signal changes.

18. The switch control circuit according to claim 16, wherein the first control circuit is configured to cause the first cut-off circuit to stop supply of the first reference voltage to the first driver circuit for a predetermined time when the state of the second switching signal changes.

19. The switch control circuit according to claim 16, further comprising:
   a reference voltage generation circuit configured to generate a reference voltage from an external power supply voltage and to supply the reference voltage to the first and second cut-off circuits.

20. The switch control circuit according to claim 16, further comprising:
   a decoder configured to receive an input control signal and output the first and second switching signals.

* * * * *